(12) United States Patent
Yanagisawa et al.

(10) Patent No.: US 7,094,355 B2
(45) Date of Patent: Aug. 22, 2006

(54) LOCAL DRY ETCHING METHOD

(75) Inventors: Michihiko Yanagisawa, Sagamihara (JP); Tadayoshi Okuya, Yokohama (JP)

(73) Assignee: Speedfam Co., Ltd., Ayase (JP)

( * ) Notice: Subject to any disclaimer, the term of this patent is extended or adjusted under 35 U.S.C. 154(b) by 171 days.

(21) Appl. No.: 10/623,740

(22) Filed: Jul. 22, 2003

(65) Prior Publication Data

US 2004/0142571 A1  Jul. 22, 2004

(30) Foreign Application Priority Data

Jul. 22, 2002  (JP) .............................. 2002-213179

(51) Int. Cl.
*H01L 21/00* (2006.01)
*B44C 1/22* (2006.01)

(52) U.S. Cl. .............................. 216/79; 216/58; 216/59; 216/67; 134/2; 134/95.3; 438/706; 438/710; 438/719; 438/722; 438/723

(58) Field of Classification Search .................. 216/59, 216/67, 58, 79; 134/2, 95.3; 118/723 MW; 438/706, 710, 719, 722, 723
See application file for complete search history.

(56) References Cited

U.S. PATENT DOCUMENTS

| | | | | |
|---|---|---|---|---|
| 5,358,806 A | * | 10/1994 | Haraichi et al. | ............... 430/5 |
| 5,953,578 A | * | 9/1999 | Lee | ............... 438/9 |
| 5,997,653 A | * | 12/1999 | Yamasaka | ............... 134/2 |
| 6,117,778 A | * | 9/2000 | Jones et al. | ............... 438/692 |
| 6,360,687 B1 | * | 3/2002 | Yanagisawa et al. | ............... 118/723 MW |
| 6,381,300 B1 | * | 4/2002 | Ezaki | ............... 378/35 |

FOREIGN PATENT DOCUMENTS

| | | |
|---|---|---|
| JP | 4-318927 | 11/1992 |
| JP | 6-168920 | 6/1994 |
| JP | 2001-93871 | 4/2001 |
| JP | 2001-144072 A * | 5/2001 |
| JP | 2001-230236 | 8/2001 |

* cited by examiner

*Primary Examiner*—Shamim Ahmed
(74) *Attorney, Agent, or Firm*—Morrison & Foerster LLP

(57) ABSTRACT

This invention provides a local dry etching method comprising the step of removing an oxide film formed on the surface of a semiconductor wafer before unevenness on the semiconductor wafer is removed by scanning the surface of the semiconductor wafer at a controlled relative speed with a nozzle for applying a flow of activated species gas to the surface of the semiconductor wafer. The removal of this oxide film is carried out by widening an etching profile and a scan pitch and making the nozzle speed constant, and then flattening is carried out in the same local dry etching apparatus. For flattening, the nozzle speed is changed for each area according to initial unevenness.

6 Claims, 4 Drawing Sheets

LOCAL DRY ETCHING METHOD

This application is based on application No. 2002-213179 filed in Japan, the contents of which are hereby incorporated by reference.

BACKGROUND OF THE INVENTION

1. Field of the Invention

The present invention relates to a local etching method. The local etching method is to planarize or make the thickness of a semiconductor wafer uniform by locally etching projections on the surface of the semiconductor wafer with an activated species gas.

2. Description of the Related Art

FIG. 1 is a diagram for explaining the principle of a method of flattening a wafer by local dry etching using plasma. Reference numeral 100 denotes a plasma generating unit and a flow of activated species gas G contained in plasma generated by the plasma generating unit 100 is applied to the surface of a semiconductor wafer W from a nozzle 101. The semiconductor wafer W is fixed on a stage 120 which is scanned at a rate controlled in a horizontal direction relative to the nozzle 101.

The semiconductor wafer W varies in thickness according to position and has fine unevenness when it is supplied. Prior to dry etching for flattening, the thickness in each sectioned area of the semiconductor wafer W is measured. This measurement is carried out in the air to obtain data on the position of each area and the thickness of the semiconductor at that position, that is, position-thickness data. In the local dry etching method, the removal of a material in each area corresponds to a time during which the area is exposed to the activated species gas G. Therefore, the relative speed of the nozzle passing by the semiconductor wafer (to be referred to as "nozzle speed" hereinafter) is determined such that the nozzle moves relatively slowly over a relatively thick portion Wa and relatively fast over a relatively thin portion.

FIG. 2 is a graph showing the removal (depth) of the semiconductor wafer material per unit time with a flow of activated species gas, that is, etching rate distribution. This curve called "etching rate profile" is very similar to a Gaussian distribution curve. As shown in FIG. 2, the etching rate E has the maximum value Emax at the center line of the nozzle 101 and decreases as the distance from the center toward the radial direction r increases.

Thus, as the material removing capability shows a distribution according to the distance from the center of the nozzle, the removal of the material required for one area cannot be determined only by the nozzle speed of that area. That is, even if a required amount of the material is removed in one area, when an adjacent area or an area adjacent to that area is to be etched, the material in the first area is removed according to the above etching rate profile.

Thus, one area is influenced by the etching of all the other areas. Therefore, the nozzle speed is calculated so that the surface heights of all the areas become the same as a result of the totalization of these influences on all the areas.

Currently, most semiconductor wafer materials are slices of silicon monocrystals. In general, the semiconductor wafers are exposed to air before local dry etching. During this, a very thin oxide film made from $SiO_2$ is formed on the surface. This oxide film is naturally formed but a chemically stable oxide film may be intentionally formed in a case to protect the wafer from contamination. In this case, the oxide film is generally made thicker than a natural oxide film.

When local dry etching is carried out at the nozzle speed obtained from the above position-thickness data and calculation, a desired flat surface should be obtained. However, when local dry etching is actually carried out, unevenness which cannot be explained as a simple error remains, which is becoming a problem to be solved. As understood from the graph of FIG. 5, unevenness corresponding to the scan pitch remains. The present invention which is aimed to solve the above problem that the above unevenness remains after local dry etching has been accomplished based on the finding that this problem is caused by the above oxide film.

SUMMARY OF THE INVENTION

The above problem can be solved by the following means. That is, according to a first aspect of the present invention, there is provided a local dry etching method which comprises removing an oxide film formed on the surface of a semiconductor wafer before unevenness on the semiconductor wafer is removed by scanning the surface of the semiconductor wafer at a controlled relative speed of a nozzle for applying a flow of activated species gas to the surface of the semiconductor wafer.

According to a second aspect of the present invention, there is provided a local dry etching method which comprises a flatness measuring step, sending-in step, oxide film removing step, flattening etching step and sending-out step. In the flatness measuring step, unevenness on the surface of the semiconductor wafer is measured in the air. In the sending-in step, the semiconductor wafer whose surface unevenness has been measured in the above flatness measuring step is carried into a vacuum chamber. In the subsequent oxide film removing step, a flow of activated species gas is applied from a nozzle and a predetermined etching profile and scan pitch are provided to this flow to scan the surface of the semiconductor wafer. The oxide film on the surface of the semiconductor wafer is thereby removed.

In the subsequent flattening etching step, the semiconductor wafer whose oxide film has been removed is etched while giving a predetermined pitch, etching profile and a scanning speed which differs by each position and is calculated based on the position-thickness data obtained in the above flatness measuring step. Unevenness on the surface of the semiconductor wafer is thereby removed, and the above semiconductor wafer is carried out form the above vacuum chamber in the sending-out step.

According to the above two inventions, as the oxide film on the semiconductor wafer is removed before unevenness is removed, the material is etched substantially as calculated without being influenced by the oxide film when unevenness is removed. Therefore, unevenness caused by the oxide film substantially does not remain on the semiconductor wafer which has been subjected to this local dry etching method.

According to a third aspect of the present invention, there is provided a local dry etching method in which the removal of the above oxide film and the removal of the above unevenness is carried out with the same nozzle in the local dry etching method of the first or second aspect of the present invention. The need of preparing an other nozzle in the chamber is eliminated and a conventional local dry etching apparatus can be used as it is.

According to a fourth aspect of the present invention, there is provided a local dry etching method in which the removal of the above unevenness is carried out in the vacuum chamber while a vacuum is maintained right after the removal of the above oxide film is carried out in the vacuum chamber in the local dry etching method of the above three aspects of the present invention. The need of preparing another vacuum chamber is eliminated, and the semiconductor wafer does not need to be carried from this vacuum chamber, thereby making it possible to use a conventional local dry etching apparatus as it is.

According to a fifth aspect of the present invention, there is provided a local dry etching method wherein the removal of the above oxide film is carried out by scanning the nozzle at a constant rate in the local dry etching method of the first to fourth aspects of the present invention. When the oxide film is substantially uniform in thickness over the entire surface of the semiconductor wafer, this is particularly effective.

According to a sixth aspect of the present invention, there is provided a local dry etching method wherein the removal of the above oxide film is carried out by making the etching profile of the activated species gas and the scan pitch wider than when the above unevenness is removed in the local dry etching method of the first to fifth aspects of the present invention. According to a seventh aspect of the present invention, there is provided a local dry etching method wherein the width of the etching profile is adjusted by the displacement of the gas in the chamber pumped from a duct provided around the nozzle and the delivery of the activated species gas corresponding to this displacement in the local dry etching method of the sixth aspect of the present invention. In the former, the oxide film can be removed at a high rate by widening the etching profile and the scan pitch whereas in the latter, the removing rate is further adjusted by the displacement of the gas in the chamber and the delivery of the activated species gas corresponding to the displacement, there by making it possible to easily control the rate from the outside of the apparatus.

According to an eighth aspect of the present invention, there is provided a local dry etching method wherein the above activated species gas includes fluorine radicals in the local dry etching method of the first to seventh aspects of the present invention.

According to a ninth aspect of the present invention, there is provided a local dry etching apparatus which comprises a vacuum chamber, vacuum pump, stage, plasma generator, nozzle, duct, exhaust gas pumping rate control unit, X-y drive unit and control unit. The vacuum pump is used to discharge gas in the vacuum chamber, the stage is installed in the vacuum chamber, and a semiconductor wafer is mounted on the stage. The plasma generator generates plasma to produce an activated species gas which is applied to the surface of the semiconductor wafer on the stage. The duct is provided around the nozzle and connected to the vacuum pump so that the gas in the vacuum chamber is pumped through this duct. The exhaust gas pumping rate control unit is provided between the vacuum pump and the vacuum chamber to control the pumping rate of the gas pumped by the vacuum pump so that the etching profile of a flow of activated species gas formed by the exhaust gas passing around the nozzle is adjusted. The X-Y drive unit can move the nozzle in two directions along the surface of the semiconductor wafer on the stage relatively and is controlled by the control unit.

Other objects and advantages besides those discussed above shall be apparent to those skilled in the art from the description of a preferred embodiment of the invention which follows. In the description, reference is made to accompanying drawings, which form a part thereof, and which illustrate an example of the invention. Such example, however, is not exhaustive of various embodiments of the invention, and therefore reference is made to the claims which follow the description for determining the scope of the invention.

BRIEF DESCRIPTION OF THE DRAWINGS

The accompanying drawings, which are incorporated in and constitute a part of the specification, illustrate embodiments of the invention and together with the description, serve to explain the principles of the invention.

DETAILED DESCRIPTION OF THE PREFERRED EMBODIMENTS

Now, preferred embodiments of the present invention will be described in detail while referring to the accompanying drawings.

The nozzle speed in local dry etching is calculated from the previously obtained position-thickness data, the scan intervals of the nozzle, that is, scan pitch and etching profile. The etching profile used herein is obtained in advance using silicon without an oxide film formed thereon.

Figure 1:
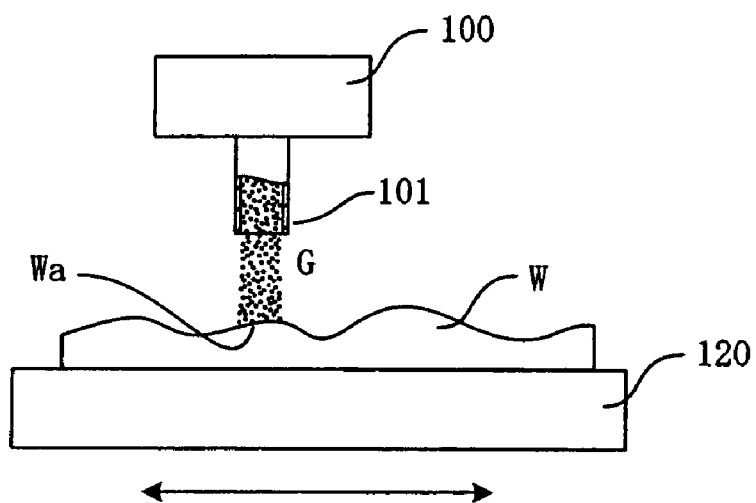
FIG. 1 is a diagram for explaining the principle of a method of flattening a wafer by local dry etching using plasma.
Figure 2:
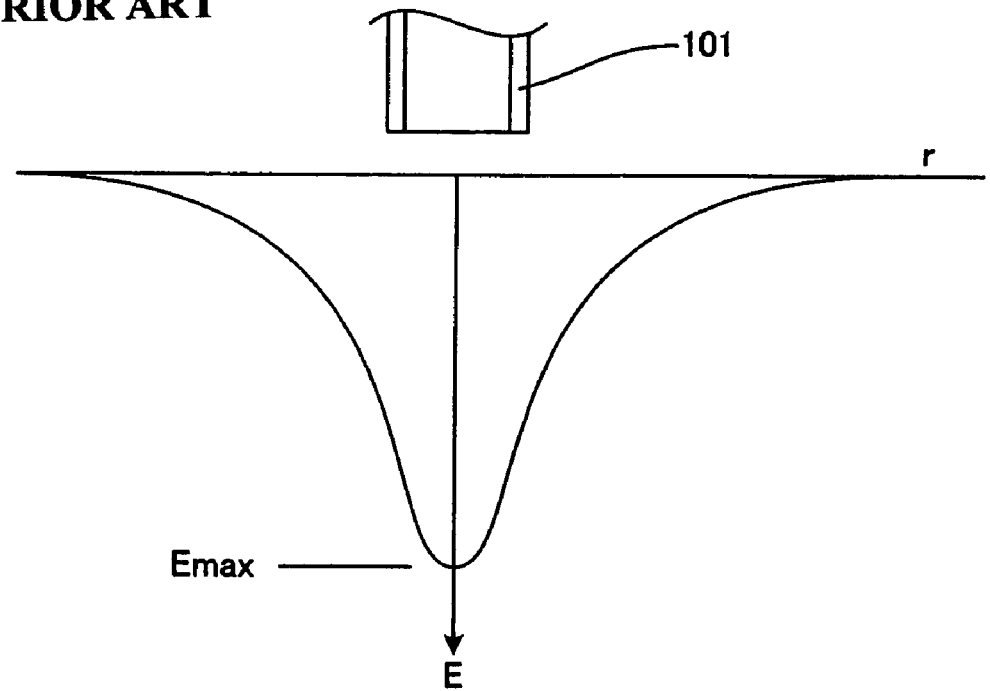
FIG. 2 is a graph showing the etching rate distribution of a flow of activated species gas.
Figure 3:
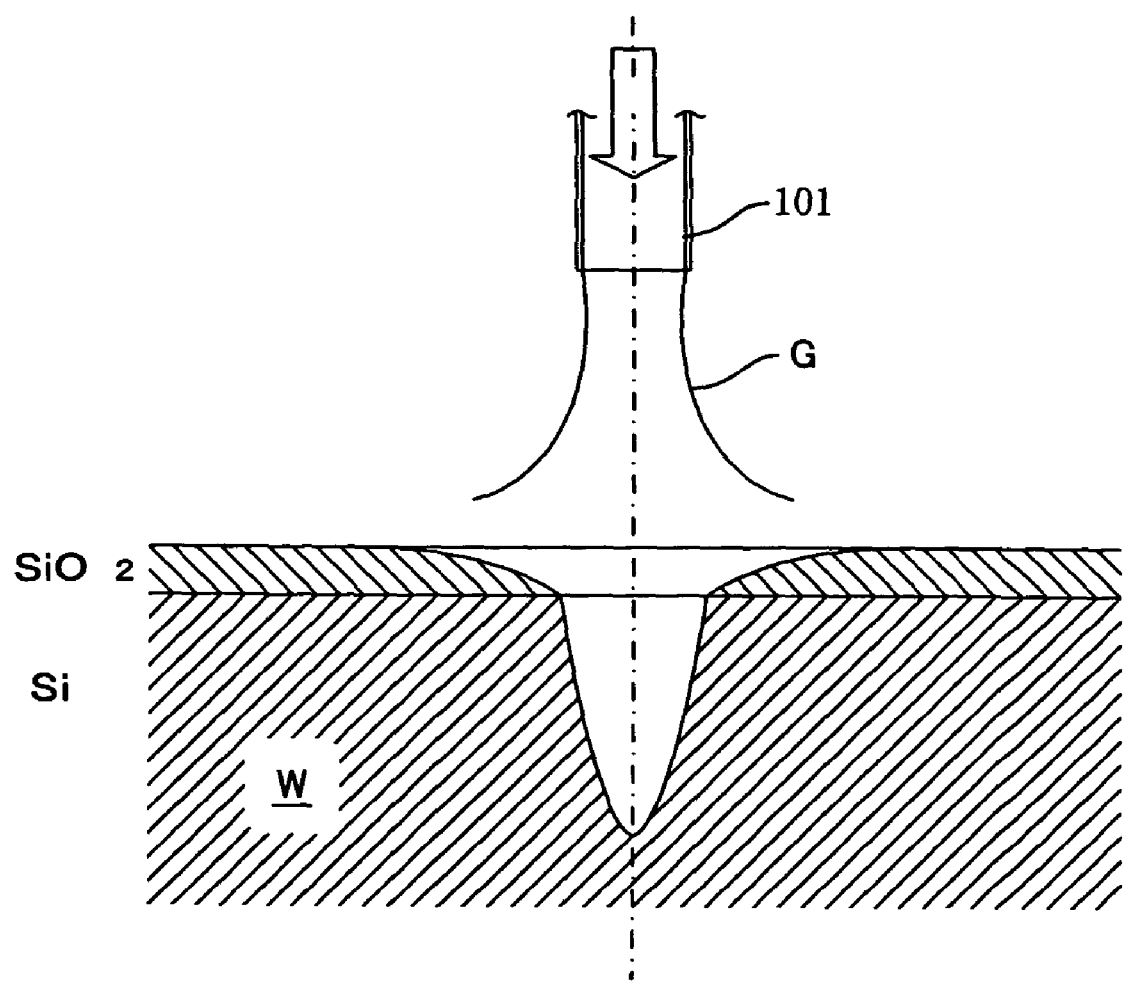
FIG. 3 is a diagram for explaining the change of an etching profile by the influence of an oxide film.

Silicon itself is dry etched much more easily than silicon oxide $SiO_2$. Therefore, when a flow of activated species gas is applied to a semiconductor wafer having an oxide film formed thereon, only the oxide film on the surface is etched at a low speed according to the predetermined etching profile of silicon oxide. However, when all the oxide film at the center is removed while application is continued, silicon itself underlying the oxide film is exposed to this gas. As described above, silicon itself is dry etched much more easily than the oxide, dry etching of the center portion proceeds quickly. The diagram of FIG. 3 shows this state in an exaggerated manner.

This means that the substantial or effective etching profile of this semiconductor wafer having an oxide film formed thereon greatly changes and there will be a large difference between the result of actual etching and the results of calculated etching. Further, as the etching profile in this case changes along with the proceeding of etching, it is substantially difficult to calculate the nozzle speed by taking into consideration this change.

In the present invention, local dry etching is carried out on the semiconductor wafer for flattening after the oxide film on the semiconductor wafer is removed and silicon itself is exposed to the surface.

Figure 4:
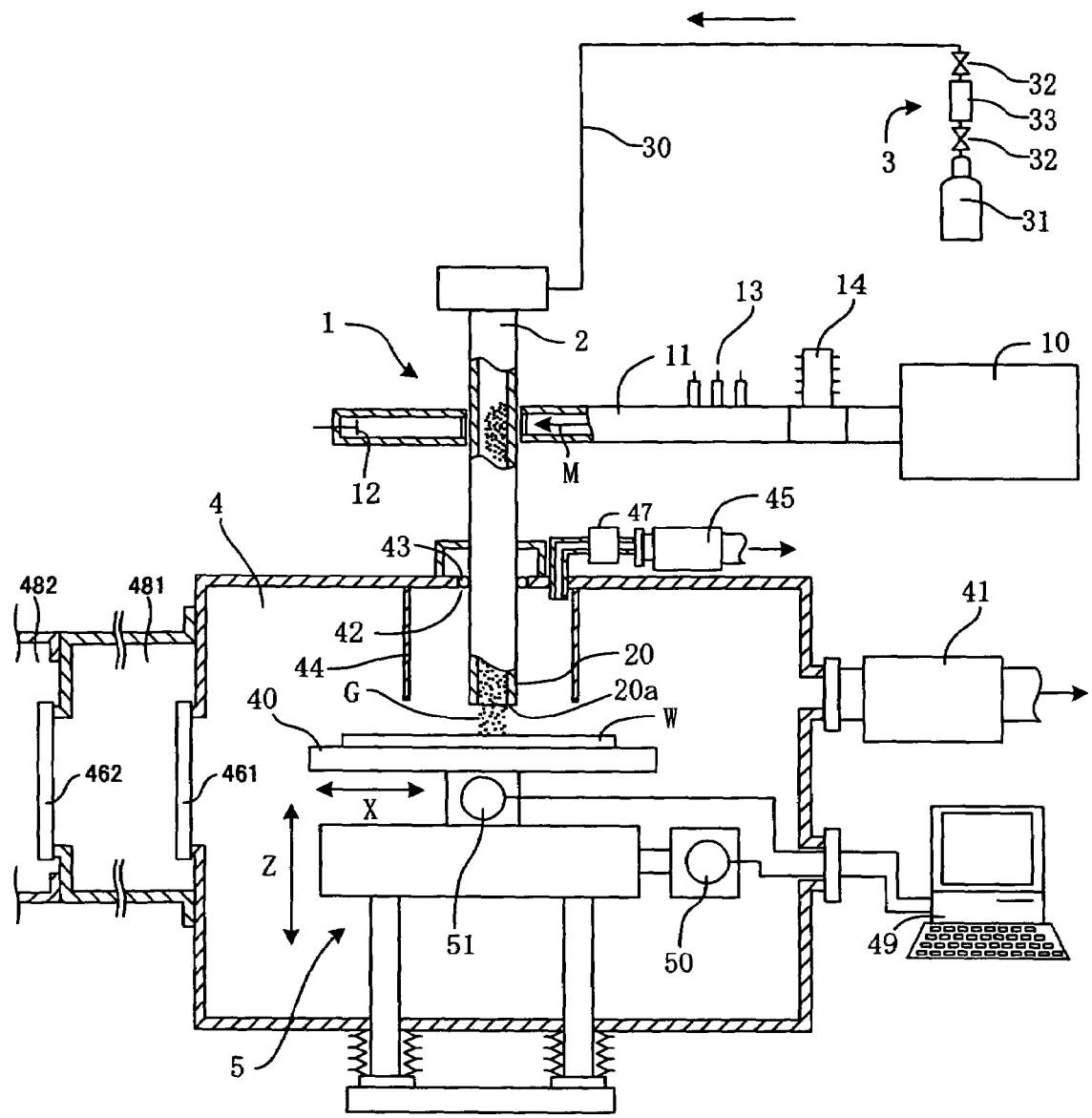
FIG. 4 is a diagram showing an example of an apparatus for carrying out a local dry etching method.

FIG. 4 is a diagram showing an example of an apparatus for carrying out the local dry etching method of the present invention. The local etching apparatus comprises a plasma generator 1, gas supply unit 3, vacuum chamber 4 and X-Y drive unit 5. A conveyance chamber 481 is provided next to the vacuum chamber 4 and a road chamber 482 is provided next to the conveyance chamber 481.

The road chamber 482 is a small-capacity chamber provided to facilitate the control of pressure so that its pressure become equal to the pressure of the vacuum chamber 4 when the semiconductor wafer W is sent in or out from the vacuum chamber 4. The conveyance chamber 481 houses an unshown conveyance robot for carrying the wafer between the vacuum chamber 4 and the road chamber 482. Send-in/send-out doors 461 and 462 provided between the chambers are used to prevent the air from moving between the chambers.

The plasma generator 1 is an apparatus for generating an activated species gas G containing neutral radicals by producing plasma in an alumina discharge tube 2 and comprises a microwave oscillator 10 and a waveguide 11. The microwave oscillator 10 is a magnetron which can oscillate a microwave M having a predetermined frequency.

The waveguide 11 propagates the microwave M oscillated from the microwave oscillator 10 and is fitted onto the alumina discharge tube 2. A reflector (short plunger) for reflecting the microwave M to form a standing wave is installed in the inside of the left end of the waveguide 11. Further, stub tuners 13 for adjusting the phase of the microwave M and an isolator 14 for bending the reflected microwave M going toward the microwave generator 10 at 90° (surface direction in FIG. 4) are fitted onto the waveguide 11.

The alumina discharge tube 2 is a cylinder having a nozzle 20 at the lower end and connected to the supply pipe 30 of the gas supply unit 3 at the upper end. The gas supply unit 3 supplies gas into the alumina discharge tube 2, has an $SF_6$ (sulfur hexafluoride) gas cylinder 31 which is connected to the supply pipe 30 through valves 32 and a pumping rate controller 33. The sulfur hexafluoride gas is used alone in this case. However, another gas may be supplied to the supply pipe 30 at the same time to form a mixed gas containing the sulfur hexafluoride gas.

When the gas is supplied into the alumina discharge tube 2 from the gas supply unit 3 and the microwave M is oscillated by the microwave oscillator 10, plasma is generated in the alumina discharge tube 2. The activated species gas G formed by this is delivered from the nozzle 20.

The semiconductor wafer W is mounted on a wafer table 40 in the vacuum chamber 4 and adsorbed to the wafer table 40 by static electricity. A vacuum pump 41 is installed in the vacuum chamber 4 so that the inside of the vacuum chamber 4 can be pumped (depressurized) by this vacuum pump 41. A hole 42 is formed in the top center portion of the chamber 4, and the nozzle 20 of the alumina discharge tube 2 is inserted into the vacuum chamber 4 through this hole 42. An O-ring 43 is fitted between the hole 42 and the alumina discharge tube 2 to keep the gap between the hole 42 and the alumina discharge tube 2 airtight. A duct 44 is provided around the nozzle 20 inserted into the hole 42. The duct 44 is connected to another vacuum pump 45 so that gas formed by a reaction at the time of etching is pumped to the outside of the vacuum chamber 4 through the duct 44. The duct 44 is arranged to surround the nozzle 20. When an exhaust gas passes through the duct 44, the etching profile of the activated species gas can be adjusted by the pumping rate of this exhaust gas as the gas in the vacuum chamber comes into the duct concentratedly. A pumping rate control unit 47 for controlling the pumping rate of an exhaust gas is provided between the vacuum pump 45 and the vacuum chamber 4, thereby making it easy to adjust the etching profile. If the discharge of the vacuum pump 45 can be adjusted, whether the pumping rate control unit 47 is provided or not is at a user's option.

The X-Y drive unit 5 is installed in the chamber 4 and supports the wafer table 40 from below. The X-Y drive unit moves the wafer table 40 in a horizontal direction in FIG. 4 by an X drive motor 50 and moves the wafer table 40 and the X-drive motor 50 together in a direction perpendicular to the sheet of FIG. 4 by a Y drive motor 51. That is, the nozzle 20 can be moved in X and Y directions relative to the semiconductor wafer W by this X-Y drive unit 5.

When the valves 32 of the gas supply unit 3 are opened, an $SF_6$ gas in the cylinder 31 flows out into the supply pipe 30 and is supplied to the alumina discharge tube 2. The pumping rate of the $SF_6$ gas is adjusted by the openings of the valves 32.

The microwave oscillator 10 is driven simultaneously with the supply of the above $SF_6$ gas or a mixed gas thereof. The $SF_6$ gas in the alumina discharge tube 2 is changed to plasma by microwave M. The activated species gas G containing neutral F (fluorine) radicals is formed by this. The activated species gas G is guided into the nozzle 20 of the alumina discharge tube 2 and applied to the surface of the semiconductor wafer W from the opening 20a of the nozzle 20.

Simultaneously with the application of the activated species gas, the X-Y drive unit 5 is controlled by a control computer 49 and the wafer table 40 moves along a predetermined locus at the previously calculated speed.

The applied activated species gas causes a chemical reaction with the material on the surface of the semiconductor wafer. Since the product formed by this chemical reaction is gaseous, this formed gas can be easily removed (flown away) from that site. Thereby, the material is removed from the surface of the semiconductor wafer W. As the amount of removal is substantially in proportion to a time during which the surface of the material is exposed to the activated species gas, it is controlled by adjusting the speed of the nozzle 20 relative to the semiconductor wafer W. This relative speed is determined based on data on unevenness on the semiconductor wafer which have been measured in advance, that is, position-thickness data.

The method of the present invention is carried out using the above local dry etching apparatus and its procedure is as follows. A send-in/send-out door 462 out of the send-in/send-out doors for separating the chamber 4 in a vacuum, the conveyance chamber 481 and the road chamber 482 from one another is opened (send-in/send-out door 461 is kept closed), and the semiconductor wafer W having an oxide film formed thereon is brought into the send-in chamber 481 from the road chamber 482 by an unshown robot. Then, the send-in/send-out door 462 is closed, the send-in/send-out door 461 is opened instead, the robot carries the wafer into the vacuum chamber 4, places it on the wafer table 40 and fixes it on the wafer table 40. Subsequently, the send-in/send-out door 461 is closed, and the valves 32 are opened to supply the $SF_6$ gas in the cylinder 31 into the alumina discharge tube 2.

The microwave oscillator 10 is activated to change the $SF_6$ gas in the alumina discharge tube 2 to plasma to generate a fluorine activated species gas and discharge it from the opening 20a of the nozzle. The gas delivery capacity is reduced by adjusting the vacuum pump 45 or the pumping rate control unit 47. This is aimed to reduce the pumping rate of inside gas sucked into the duct 33 and widen the etching profile. When the discharge capacity is increased by the vacuum pump 45 or the pumping rate control unit 47, the activated species gas from the opening 20a is narrowed by a flow of the inside gas sucked into the duct 44, thereby making it possible to narrow the etching profile.

Next, the X drive motor 50 and the Y drive motor 51 are driven to move the wafer table 40 from its shelter position so that the wafer W is situated right below the opening 20a. Then, the nozzle 20 scans the wafer at the predetermined wide scan pitch. At this point, as the etching profile and the scan pitch are both wide, the entire surface of the wafer is uniformly etched and the entire oxide film on the surface is removed leaving the initial unevenness substantially. The nozzle speed is basically a constant speed.

Thereafter, the scan pitch is changed to a narrow pitch for flattening, the etching profile is narrowed by the vacuum pump 45 or the pumping rate control unit 47, and scanning is performed at the previously calculated nozzle speed (differs according to each area). Since the oxide film was removed in the previous stage, etching is carried out as planned faithfully, thereby substantially preventing unevenness from remaining after etching.

Figure 5:
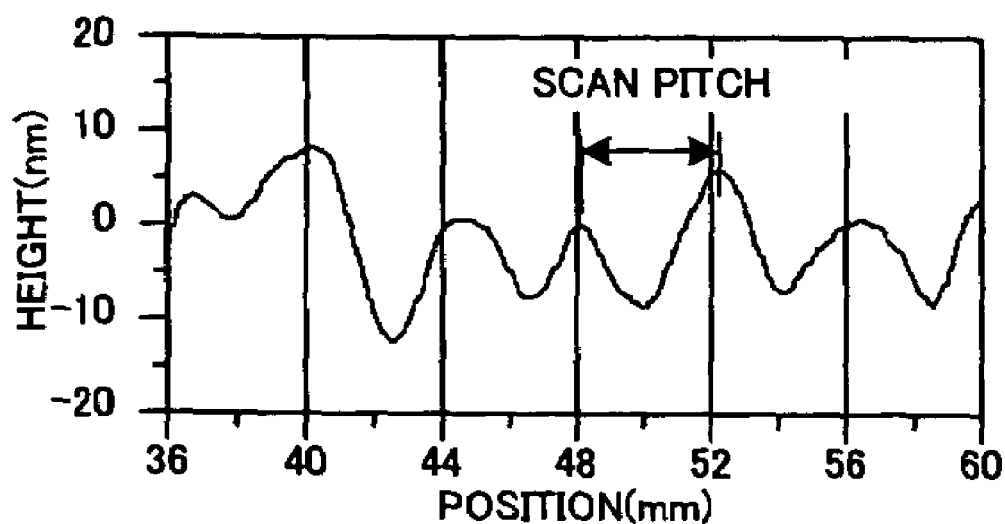
FIG. 5 is a graph showing the processing results of the conventional local dry etching method.
Figure 6:
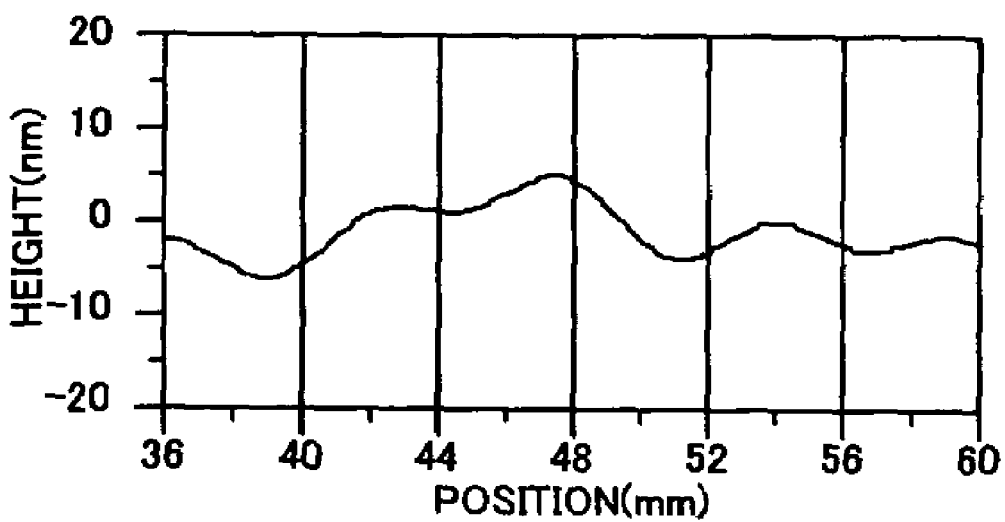
FIG. 6 is a graph showing the processing results of the local dry etching method of the present invention.

When the wafer table 40 is moved to a shelter position and the send-in/send-out door 461 is opened after the end of flattening, the unshown robot takes out the etched wafer W and brings it into the send-in chamber 482. Thereafter, the send-in/send-out door 461 is closed, the send-in/send-out door 462 is opened, and the robot places this wafer W in the road chamber 482 and carries a new wafer into the vacuum chamber 4 according to the previously mentioned procedure. The etched wafer is supplied from the road chamber 482 to the next step. The results of this process are shown in the graph of FIG. 6. Unlike the graph of FIG. 5, unevenness corresponding to the scan pitch is not seen in the graph of FIG. 6.

A cassette storing 25 wafers may be carried in and out in stead that the wafers are carried into the road chamber 482 from the outside one by one or out to the outside one by one as described above. In this case, labor and energy for pumping the inside of the road chamber 482 can be reduced.

As described above, according to this embodiment, since the oxide film formed on the surface of the semiconductor wafer is removed before unevenness on the semiconductor wafer is removed, predetermined etching is carried out at a nozzle speed calculated based on the etching profile required for silicon alone. Thereby, the material is removed without being influenced by the oxide film, whereby unevenness substantially caused by the oxide film does not remain on the semiconductor wafer subjected to this local dry etching.

Since the same nozzle 20 is used to remove the oxide film and unevenness (flattening), the need of preparing another nozzle in the chamber is eliminated and a conventional local dry etching apparatus can be used as it is. Further, as the width of the etching profile is adjusted by the displacement (exhaust speed) of gas in the chamber to be pumped from the duct provided around the nozzle and the delivery of the activated species gas corresponding to this displacement, the same nozzle can be used and the width of the etching profile can be easily controlled from the outside of the apparatus.

Further, since the removal of unevenness is carried out after the removal of the oxide film while a vacuum in the vacuum chamber is maintained, the need of preparing another dedicated vacuum chamber is eliminated, whereby there is no trouble of carrying the semiconductor wafer between the vacuum chambers and a conventional local dry etching apparatus can be used as it is.

When a semiconductor wafer having an oxide film formed thereon is to be flattened by local dry etching, according to the present invention, since the oxide film on the surface is removed in advance, the problem of the prior art that unevenness remains on the surface after etching is solved. For the removal of the oxide film which is carried out in advance, a vacuum chamber and a nozzle which are used for flattening can be used and therefore, there is no trouble of carrying the wafer between different chambers or exchanging the nozzle with another one, and a conventional local dry etching apparatus can be substantially used as it is.

Although only preferred embodiments are specifically illustrated and described herein, it will be appreciated that many modifications and variations of the present invention are possible in light of the above teachings and within the purview of the appended claims without departing from the spirit and intended scope of the invention.

What is claimed is:

1. A local dry etching method for flattening a semiconductor wafer by removing unevenness from a surface of the wafer using a nozzle for applying a flow of an activated species gas to the surface of the wafer, the method comprising;

providing a semiconductor wafer having a silicon oxide film formed on a surface thereof;

removing the silicon oxide film by moving the nozzle for applying the flow of the activated species gas at a speed relative to the semiconductor wafer so that silicon is exposed on the surface of the semiconductor wafer; and etching the exposed silicon by moving the nozzle for applying the flow of the activated species gas at a controlled speed relative to the semiconductor wafer.

2. A local dry etching method according to claim 1, wherein the removal of the silicon oxide film and the etching of the exposed silicon are carried out in a vacuum chamber without breaking a vacuum of the chamber.

3. A local dry etching method according to claim 2, wherein the speed for moving the nozzle for removing the silicon oxide film is constant, and the speed for moving the nozzle for etching the exposed silicon is variable so as to correspond to local unevenness of the semiconductor wafer.

4. A local dry etching method according to claim 2, wherein the nozzle is moved by a pitch, and the pitch for removing the silicon oxide film is larger than the pitch for etching the exposed silicon.

5. A local dry etching method according to claim 2, wherein an etching profile of the flow of the activated species gas for removing the silicon oxide film is wider than the etching profile of the flow of the activated species gas for etching the exposed silicon by adjusting a flow-in rate of the activated species gas through the nozzle and a flow-out rate of the activated species gas through a duct surrounding the nozzle.

6. A local dry etching method according to claim 1 wherein the activated species gas comprises fluorine radicals.

* * * * *